(12) United States Patent
Rayaprolu et al.

(10) Patent No.: US 12,009,042 B2
(45) Date of Patent: *Jun. 11, 2024

(54) EXECUTING A REFRESH OPERATION IN A MEMORY SUB-SYSTEM

(71) Applicant: Micron Technology, Inc., Boise, ID (US)

(72) Inventors: Vamsi Pavan Rayaprolu, Santa Clara, CA (US); Kishore Kumar Muchherla, San Jose, CA (US); Ashutosh Malshe, Fremont, CA (US); Gianni S. Alsasua, Rancho Cordova, CA (US); Harish R. Singidi, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/980,234

(22) Filed: Nov. 3, 2022

(65) Prior Publication Data

US 2023/0059923 A1 Feb. 23, 2023

Related U.S. Application Data

(63) Continuation of application No. 17/085,445, filed on Oct. 30, 2020, now Pat. No. 11,521,699.

(51) Int. Cl.
| | | |
|---|---|---|
| *G06F 11/07* | (2006.01) | |
| *G06F 11/30* | (2006.01) | |
| *G06F 12/02* | (2006.01) | |
| *G06F 12/0882* | (2016.01) | |
| *G11C 29/10* | (2006.01) | |
| *G11C 29/42* | (2006.01) | |
| *G11C 29/44* | (2006.01) | |

(52) U.S. Cl.
CPC ............ *G11C 29/42* (2013.01); *G06F 11/076* (2013.01); *G06F 11/3037* (2013.01); *G06F 12/0246* (2013.01); *G06F 12/0882* (2013.01); *G11C 29/10* (2013.01); *G11C 29/44* (2013.01)

(58) Field of Classification Search
CPC ......... G11C 29/42; G11C 29/10; G11C 29/44; G06F 11/076; G06F 11/3037; G06F 12/0246; G06F 12/0882
See application file for complete search history.

(56) References Cited

U.S. PATENT DOCUMENTS 10,553,290 B1 2/2020 Muchherla et al.
2015/0363261 A1* 12/2015 Warnes .................. G11C 29/20
714/721
(Continued)

FOREIGN PATENT DOCUMENTS

CN 111383683 A 7/2020

OTHER PUBLICATIONS

Office Action for Chinese Patent Application No. 202111270759.8, dated Aug. 26, 2023, 16 Pages.

*Primary Examiner* — Mohammed A Bashar
(74) *Attorney, Agent, or Firm* — LOWENSTEIN SANDLER LLP

(57) ABSTRACT

A trigger rate associated with a scan operation of a set of memory pages of a data block is identified. The trigger rate is compared to a threshold rate to determine that a condition is satisfied. In response to satisfying the condition, a refresh operation is executed on the set of memory pages of the data block.

20 Claims, 7 Drawing Sheets

(56) References Cited

U.S. PATENT DOCUMENTS

| | | | |
|---|---|---|---|
| 2019/0324855 A1* | 10/2019 | Yeh | G11C 29/52 |
| 2020/0090763 A1 | 3/2020 | Tokutomi | |
| 2020/0110547 A1* | 4/2020 | Lee | G11C 16/26 |
| 2020/0211664 A1 | 7/2020 | Vashi et al. | |
| 2020/0409788 A1 | 12/2020 | Kurose | |

* cited by examiner

EXECUTING A REFRESH OPERATION IN A MEMORY SUB-SYSTEM

CROSS-REFERENCE TO RELATED APPLICATION

This application is a continuation of U.S. patent application Ser. No. 17/085,445, filed on Oct. 30, 2020, the entirety of which is hereby incorporated by reference herein

TECHNICAL FIELD

Embodiments of the disclosure relate generally to memory systems, and more specifically, relate to adjust a reliability scan threshold in a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
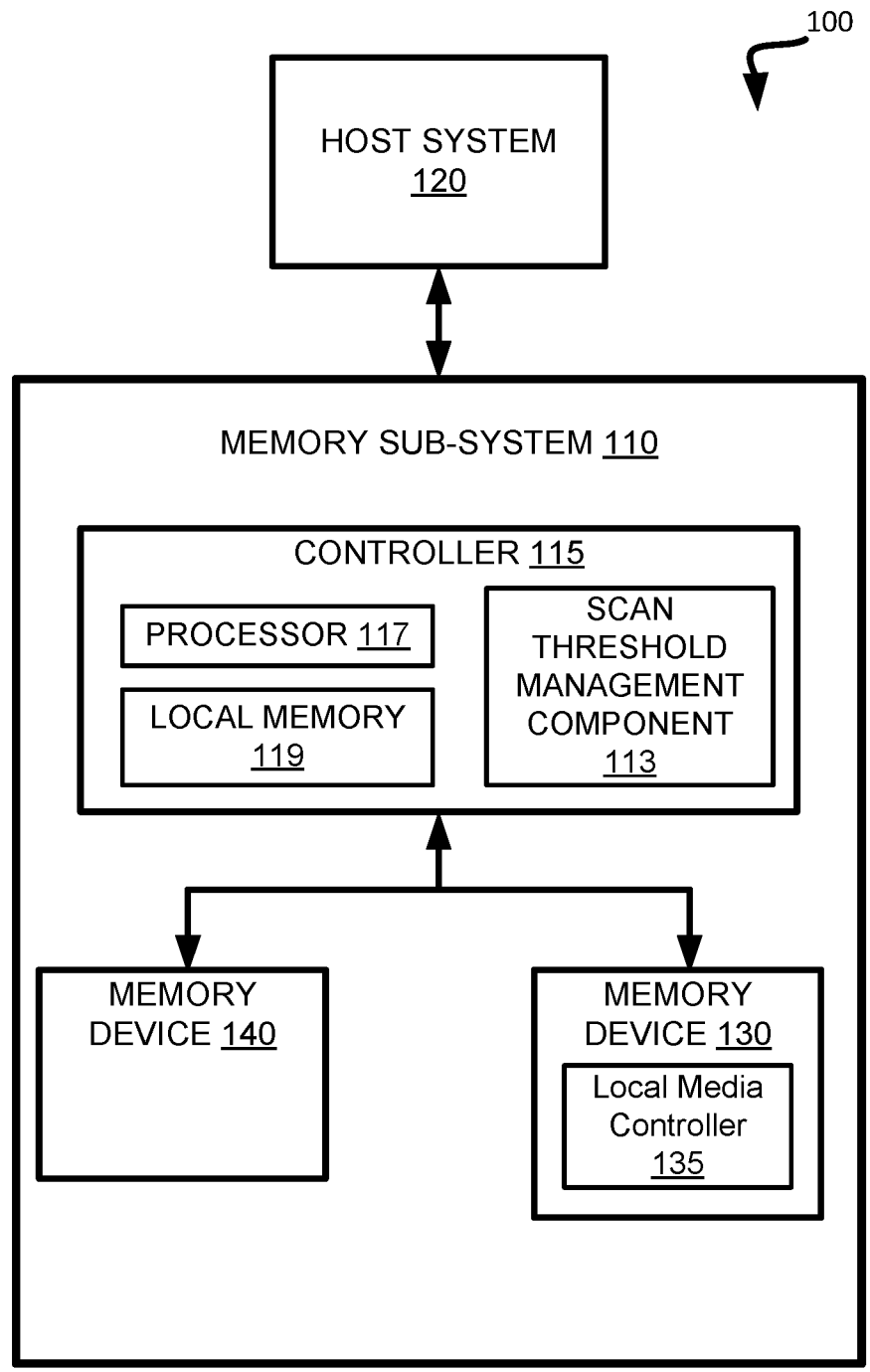
FIG. 1 illustrates an example computing system that includes a memory sub-system in accordance with one or more embodiments of the present disclosure.

Aspects of the present disclosure are directed to adjusting a reliability scan threshold in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices. The host system can provide data to be stored at the memory sub-system and can request data to be retrieved from the memory sub-system.

A memory component of a conventional memory sub-system can include memory cells that can include one or more memory pages (also referred to as "pages" hereafter) for storing one or more bits of binary data corresponding to data received from the host system. One or more memory pages of the memory component can be grouped together to form a data block. When data is written to a memory page of the memory component for storage, the memory cell can deteriorate. Accordingly, each memory page of the memory component can have a finite number of write operations performed on the memory page before the memory page is no longer able to reliably store data. Data stored at the memory pages of the memory component can be read from the memory component and transmitted to a host system. However, when data is read from a memory page of the memory component, nearby or adjacent memory pages can experience what is known as read disturb. Read disturb is the result of continually reading from one memory page (also referred to as the "aggressor memory page") without intervening erase operations, causing other nearby memory pages (also referred to as "victim memory pages") to change over time (e.g., become programmed). If too many read operations are performed on a memory page, data stored at adjacent memory page of the memory component can become corrupted or incorrectly stored at the memory page.

Conventionally, to address the errors resulting from the read disturb of the memory pages, a system can perform a scan operation (e.g., a read scrub operation) to read the data stored at each memory page of the data block to determine if the reliability statistic (e.g., raw bit error rate (RBER) or bit error rate (BER)) exceeds a threshold value due to an accumulation of read disturb effects. The scan operation can be performed once the data block reaches a reach count threshold level. If the reliability statistic (e.g., a read error count associated with a data block) for a data block exceeds a threshold value, indicating a high error rate associated with data stored at the data block due, at least in part, to read disturb, then a refresh operation is performed on the data block. The refresh operation involves the programming of the data of the data block to a new data block of the memory sub-system (herein referred to as a "refreshing" or "folding"). The folding of the data stored at the data block to the other data block can include writing the data stored at the data block to the other data block to refresh the data stored by the memory sub-system. Additionally, the refresh operation can include error management processing to correct errors in the data prior to programming the corrected data to the new data block.

In conventional systems, the threshold value, used during the scan operation to determine if a refresh operation and associated error management processing, is a static value or level. The fixed reliability threshold value is applied throughout the life of the memory component and does not change in view of a type of workload being applied to the respective data blocks. In particular, conventional systems can process different workloads including sequential read operations and random read operations that result in different read disturb stresses on the memory pages of the data block. A sequential read workload involves a uniform read pattern including the reading of multiple memory locations (e.g., logical block addresses (LBAs)) of a memory page in sequence (e.g., LBA 0, LBA 1, LBA 2 . . . LBA N). As a result of the sequential execution of the read operations, the logical block addresses of the memory page are subject to a uniform level of read disturb stress. The processing of a random read operations (also referred to as "row-hammer read pattern") involves the execution of a read operation with respect to one or more particular or targeted memory locations of the memory page (e.g., a particular stripe or row of the LBA map associated with a wordline of the memory page). In the case of a random read operation, by applying a non-uniform stress to the targeted memory locations (e.g., the aggressor memory pages), a non-uniform level of read disturb stress is experienced by the adjacent memory locations. For example, the one or more memory locations neighboring the targeted memory location experience a higher read disturb stress as compared to other memory locations of the data block due to their proximity to targeted memory location.

In this regard, the use of a static reliability threshold applied during the scan operations to determine execution of the refresh operation and associated error management operations are performed on data blocks that are subject to both uniform levels of read disturb stress and non-uniform levels of read disturb stress. However, the refreshing of a data block under a non-uniform level of read disturb stress results in the refreshing of good data (e.g., data that is not subject to read disturb errors that exceed the reliability threshold due to their relative location as compared to a targeted memory page). In this regard, if any memory page within the block has a reliability statistic (e.g., an RBER count) that exceeds the static threshold value, the entire data block is refreshed resulting in the performance of additional program and erase operations and error management processing.

Aspects of the present disclosure address the above and other deficiencies by adjusting a reliability threshold levels associated with a scan operation of a set of memory pages of a data block in view of a workload type associated with the data block. Various embodiments described herein are directed to scanning a data block to determine a health of a block in terms of one or more reliability statistics (e.g., RBER values, BER values, a trigger rate, etc.) using an adjustable reliability threshold. The data integrity check is performed on a data block of a memory component to obtain a reliability statistic for a set of sampled memory cells in the data block. The reliability statistic can correspond to an error rate for data stored at the set of memory pages of a data block. In an embodiment, the reliability statistic can correspond to RBER for data stored at the set of memory pages of the data block.

The results of a scan operation including the reliability statistic values associated with the memory pages can be compared to an adjustable reliability threshold having an initial value. Based on the scan results, a type of workload associated with the data block is determined based on type of read disturb stress exhibited by the memory pages of the data block. In response to identifying a uniform read disturb stress level (e.g., due to sequential read operations) associated with each of the memory pages of the data block, the reliability threshold value can be adjusted to a first adjusted level for use in a subsequent scan operation. In response to identifying a non-uniform read disturb stress level (e.g., due to random or row-hammer read operations) associated with the memory pages of the data block, the reliability threshold value can be adjusted to a second adjusted level for use in the subsequent scan operation. In an embodiment, the adjusted reliability threshold can be based on a reliability threshold associated with error management processing performed in connection with a refresh operation. The refresh operation can be performed in response to determining the reliability value associated with the data block exceeds the applied reliability threshold. As part of the refresh operation, the raw data of the data block is read and error management processing is performed to generate corrected data to be relocated or stored in a new data block.

The error management process can include two stages: a first hard decoding correction processing stage and a second soft decoding correction processing stage. The hard decoding correction processing involves the application of error correction processing to correct the incorrect data bits of the data block. If the error correction is unsuccessful, the hard decoding correction processing (also referred to as "hard correction") performs error handling processing to generate corrected data to be programmed to the new data block. If both the error correction and error handling processing fail to correct the data, the soft decoding correction processing stage is performed. The soft decoding correction processing (also referred to as "soft correction") involves error correction operations (e.g., parity checking or the executing of multiple read operations at different read level offset values to identify one or more low confidence and high confidence bits and estimate the data based on the identified bits). In an embodiment, the adjusted reliability threshold can be based on a reliability threshold associated with soft decoding correction processing for data blocks associated with non-uniform read disturb stresses.

Advantages of the present disclosure include, but are not limited to, reducing the number of excessive refresh operations performed by the memory sub-system. The execution of refresh operations is based on a comparison of scanned reliability data to a reliability threshold that is adjusted based on a workload type (e.g., uniform workload or non-uniform workload) associated with the data block for use in a subsequent scan operation. Advantageously, the reliability threshold used in the scan operation can be adjusted based on a reliability threshold associated with hard correction processing for a data block under uniform read disturb stress. In addition, the reliability threshold used in the scan operation can be adjusted based on a reliability threshold associated with soft correction processing for a data block under non-uniform read disturb stress.

In an embodiment, a trigger rate (e.g., a rate or ratio of a number of memory pages in the data block that fail hard correction processing as a function of a total number of memory pages of the data block that are scanned) can be identified. The identified trigger rate can be compared to a trigger rate threshold level to determine if a condition or criterion is satisfied. In response to satisfaction of the condition (e.g., the identified trigger rate exceeding the trigger rate threshold level), a determination is made that the data block is subject to uniform read disturb stress and a refresh operation is executed.

FIG. 1 illustrates an example computing system 100 that includes a memory sub-system 110 in accordance with one or more embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a scan threshold management component 113 that can be used to relocate data of a subset of a data block to another data block based on distribution of reliability statistics. In some embodiments, the controller 115 includes at least a portion of the scan threshold management component 113. For example, the controller 115 can include a processor 117 (processing device) configured to execute instructions stored in local memory 119 for performing the operations described herein. In some embodiments, the scan threshold management component 113 is part of the host system 110, an application, or an operating system.

The scan threshold management component 113 can perform a scan operation on a data block of a memory component to obtain a reliability statistic for each of a set of sampled memory cells in the data block. The scan threshold management component 113 can determine a workload type (e.g., uniform workload or non-uniform workload) associated with the data block based on the scan results. In response to identifying the workload type, the scan threshold management component 113 can adjust a reliability threshold level used to compare with the measured reliability values of the data block to determine if a refresh operation is to be performed. In an embodiment, if a uniform workload type is identified, the scan threshold management component 113 adjusts the reliability threshold level to a first adjusted reliability threshold level. In an embodiment, if a non-uniform workload type is identified, the scan threshold management component 113 adjusts the reliability threshold level to a second adjusted reliability threshold level. In an embodiment, the first adjusted reliability threshold level is based on a reliability threshold level associated with a hard correction process or stage of an error management process. In an embodiment, the second adjusted reliability threshold level is based on a reliability threshold level associated with a soft correction process or stage of an error management process. Further details with regards to the operations of the scan threshold management component 113 are described below.

Figure 2:
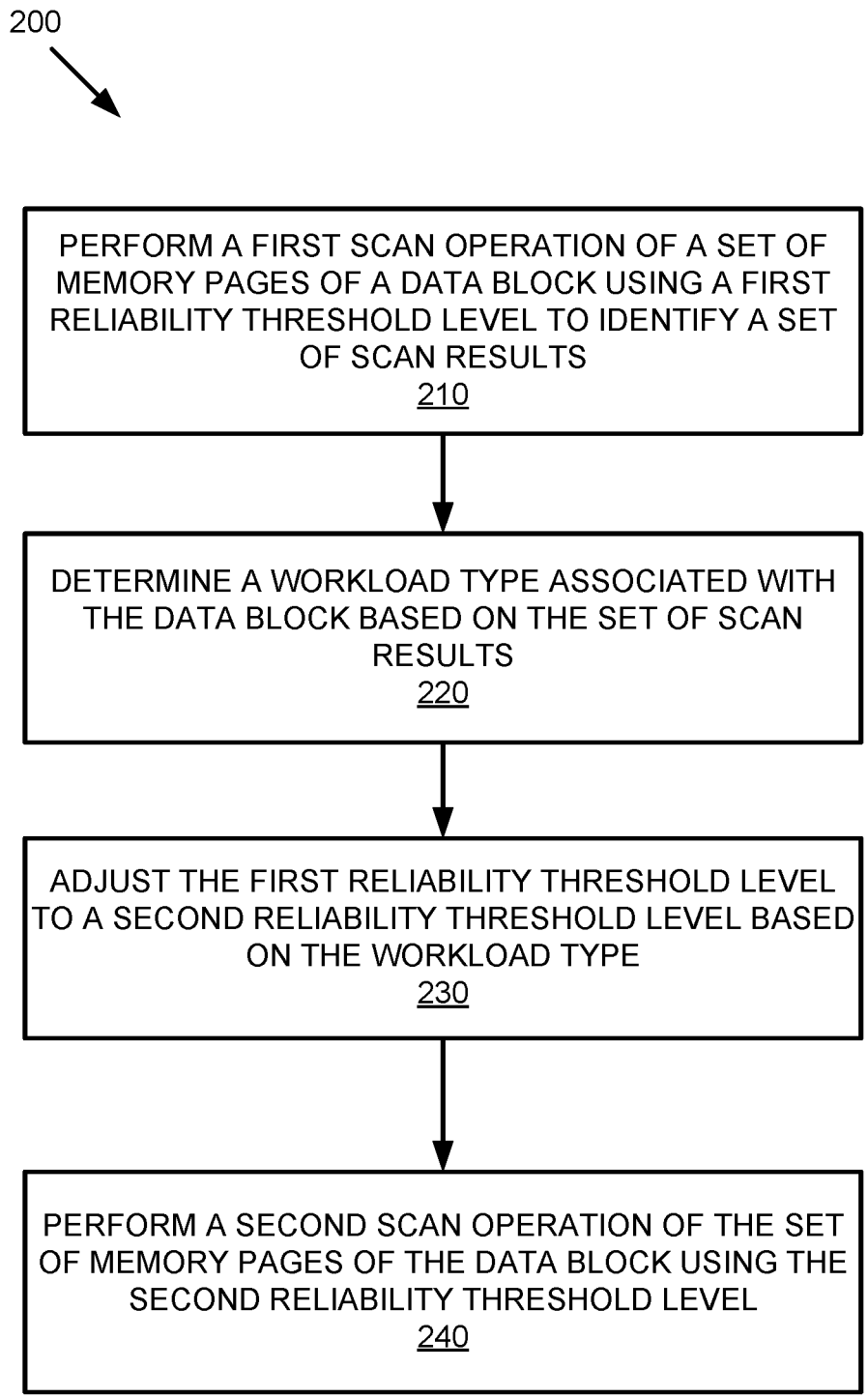
FIG. 2 is a flow diagram of an example method 200 to adjust a reliability threshold level associated with a scan operation executed on a set of memory pages of a data block, in accordance with one or more embodiments of the present disclosure.

FIG. 2 is a flow diagram of an example method 200 to adjust a reliability threshold level associated with a scan operation executed on a set of memory pages of a data block, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the scan threshold management component 113 of FIG. 1.

At block 210, the processing logic performs a first scan operation of a set of memory pages of a data block using a first reliability threshold level to identify a set of scan results. In an embodiment, the scan operation includes an identification of a reliability statistic associated with each of the memory pages of the data block. In an embodiment, the reliability statistic is a RBER value for each of the memory pages. In an embodiment, the scan operation includes reading the raw data from each of the set of memory pages and identifying an associated reliability value (e.g., an RBER value for each of the memory pages). In an embodiment, the scan results are used to determine if a refresh operation is to be performed, as described in greater detail below. In an embodiment, the first reliability threshold value can be a default threshold value (e.g., 580 bits per 16 KB of data).

Figure 3:
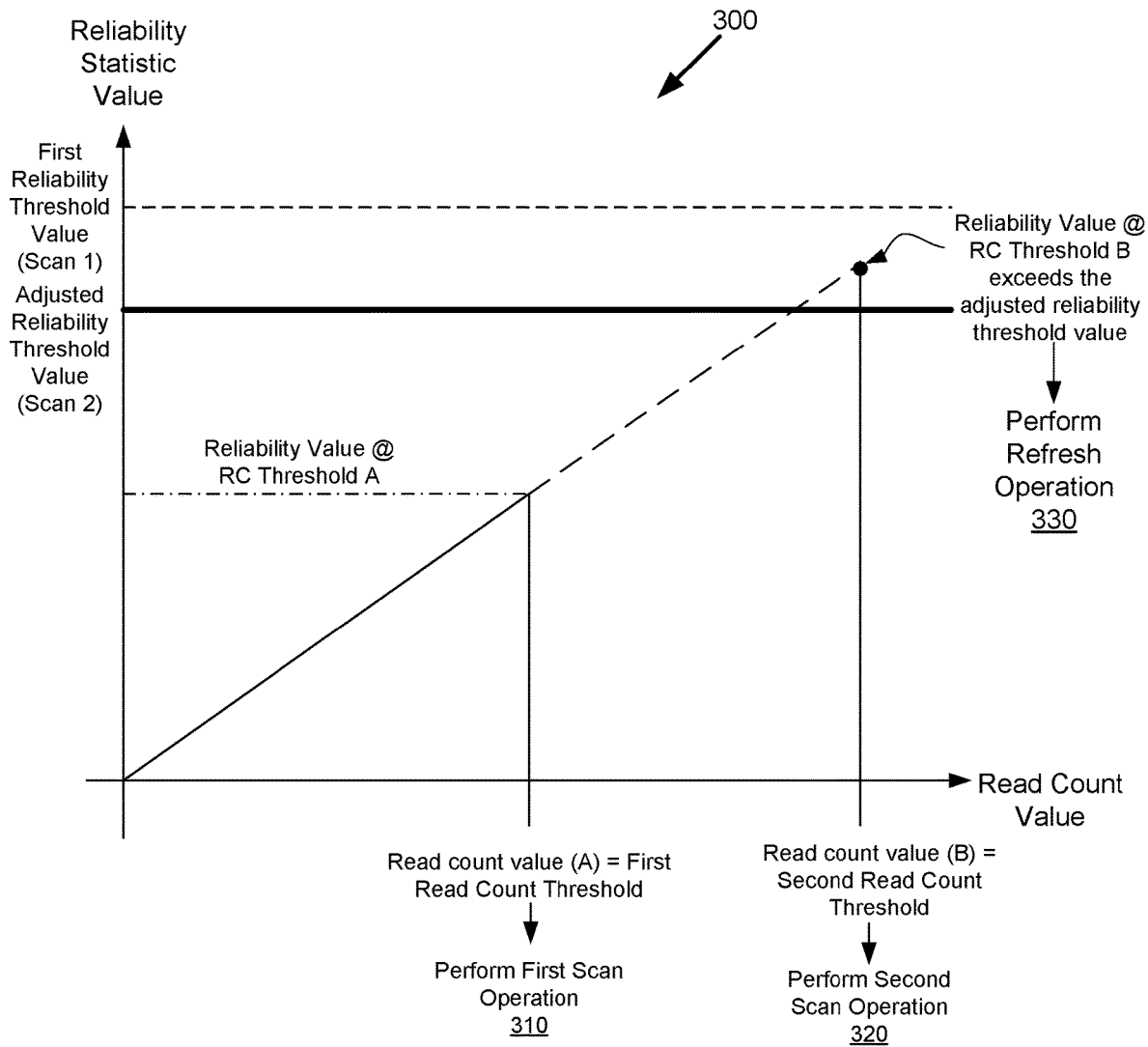
FIG. 3 illustrates an example graph 300 including a representation of managing an adjustable reliability threshold value in connection with scan operations of memory pages of a data block, in accordance with one or more embodiments of the present disclosure.

FIG. 3 illustrates an example graph 300 including a representation of managing an adjustable reliability threshold value in connection with scan operations of memory pages of a data block, according to embodiments. In an embodiment, a first threshold read count value is established (read count value A). As shown, when the read count associated with the data block reaches the first threshold read count value, a first scan operation 310 is performed to identify the reliability value of the data block at the first read count threshold value (read count value A). In an embodiment, the reliability value of the data block resulting from the first scan is compared to the first reliability threshold value. In the example shown in FIG. 3, the reliability value of the data block (e.g., RBER value) is less than the first reliability threshold value applied to the scan results of the first scan operation. In an embodiment, since the reliability value of the data block is less than the first reliability threshold value, the processing logic determines that no refresh operation is to be performed. In an embodiment, since the reliability value of the data block is less than the first reliability threshold value, the processing logic resets the read counter and continues to monitor the read counts in view of an updated read count threshold value (e.g., read count value B).

In operation 220, the processing logic determines a workload type associated with the data block based on the scan results. In an embodiment, the workload type can include a uniform workload type or a non-uniform workload type. In an embodiment, the uniform workload type is identified for a data block that is subject to a uniform or sequential workload (e.g., sequential read operations). In an embodiment, the uniform workload type is identified for the set of memory pages of the data block exhibiting a uniform read disturb stress level. In an embodiment, the uniform workload type is identified by comparing the respective reliability values associated with each memory page and determine if the reliability values is within a certain threshold range or tolerance of one another. In an embodiment, the scan results are analyzed to identify a maximum reliability value and a minimum reliability value. In an embodiment, a difference between the maximum reliability value and the minimum reliability value is determined and compared to the threshold tolerance value (e.g., 10%) to determine if the difference is greater than or less than the threshold tolerance value.

Figure 4:
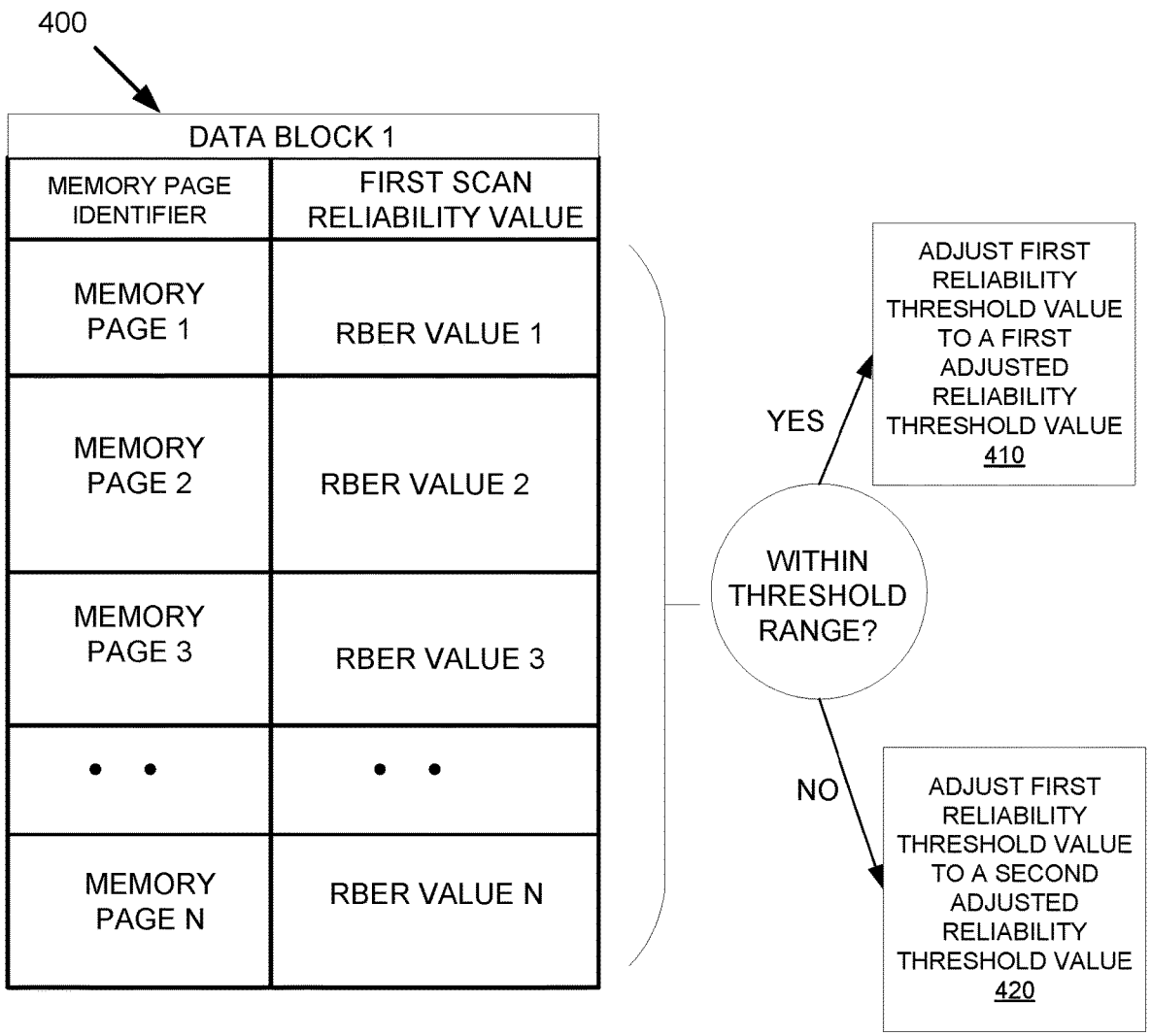
FIG. 4 illustrates one or operations associated with the management of scan results relating to a scan operation performed on a data block, in accordance with an embodiment of the present disclosure.

For example, as shown in FIG. 4, a set of scan results 400 can be identified for an example data block (data block 1). The scan results 400 can include a RBER value corresponding to each of the memory pages (e.g., RBER value 1 is identified for memory page 1, RBER value 2 is identified for memory page 2 . . . RBER value N is identified for memory page N). The RBER values for the data block 1 are compared to one another to determine if a difference between a maximum value (e.g., RBER value 2) and a minimum value (e.g., RBER value N) are within a threshold range (e.g., less than or equal to a 10% difference). If so, it is determined that all of the memory pages have a same or similar RBER values resulting from a uniform read disturb stress level and, therefore, the data block is associated with a uniform workload type.

In an embodiment, if a difference between a maximum value (e.g., RBER value 2) and a minimum value (e.g., RBER value N) are not within the threshold range, the processing logic can identify a non-uniform workload type. In an embodiment, the non-uniform workload type is identified since one or more of the memory pages are exhibiting a higher RBER value than one or more other memory pages (e.g., a value that is outside of the threshold range) as a consequence of the application of a non-uniform read disturb stress level (e.g., resulting from the execution of row-hammer read operations).

In operation 230, the processing logic adjusts the first reliability threshold level to a second reliability threshold level based on the workload type. In an embodiment, the first reliability threshold level is adjusted to a second reliability threshold level associated with a uniform workload type. In an embodiment, the second reliability threshold level is adjusted to a second reliability threshold level associated with a non-uniform workload type. In an embodiment, the second reliability threshold level associated with a uniform workload type is based on a reliability threshold associated with a first error correction process or stage (e.g., a hard correction process). For example, the second reliability threshold level can be set to a percentage (e.g., 15%) of a reliability threshold level applied during hard correction processing (e.g., 560 bits/16 KB data block).

In an embodiment, as shown in FIG. 4, if the RBER values associated with the set of memory pages (Page 1 through Page N) are within a threshold range (e.g., 10%), the processing logic adjusts the first reliability threshold value to a first adjusted reliability threshold value 410. In an embodiment, the first adjusted reliability threshold value 410 is based on a reliability threshold level associated with a hard correction phase of the error management processing.

In an embodiment, as shown in FIG. 4, if the RBER values associated with the set of memory pages (Page 1 through Page N) are not within a threshold range (e.g., 10%), the processing logic adjusts the first reliability threshold value to a second adjusted reliability threshold value 420. In an embodiment, the second adjusted reliability threshold value 420 is based on a reliability threshold level associated with a soft correction phase of the error management processing.

In an embodiment, the second reliability threshold level associated with a non-uniform workload type is based on a reliability threshold associated with a second error correction process or stage (e.g., a soft correction process). For example, the second reliability threshold level can be set to a percentage (e.g., 15%) of a reliability threshold level applied during soft correction processing (e.g., 1760 bits/16 KB data block).

In operation 240, the processing logic performs a second scan operation of the set of memory pages of the data block using the second reliability threshold level. In an embodiment, the second scan operation involves the reading of the data of the memory pages of the data block and performing error management processing including hard correction processing to identify a current or updated RBER value for the memory pages and data block. In an embodiment, the second scan operation results include a reliability statistic for the data block. In an embodiment, if the reliability statistic exceeds the second reliability threshold level, the processing logic executes a refresh operation on the data block (e.g., error management processing and relocating the corrected data to a new data block).

For example, as shown in FIG. 3, the second scan operation 320 is performed in response to a read count value associated with the data block reaching a second read count threshold value (e.g., read count value B). As shown in FIG. 3, the first reliability threshold value used in connection with scan 1 is adjusted to an adjusted reliability threshold value based on the workload type for use in connection with a subsequent scan operation (e.g., scan 2). As shown, the reliability value at read count threshold B exceeds the adjusted reliability threshold value that was adjusted based on the workload type identified in connection with the first scan operation 310. In response to determining the reliability value at read count threshold B exceeds the adjusted reliability threshold value, the processing logic performs the refresh operation 330.

Figure 5:
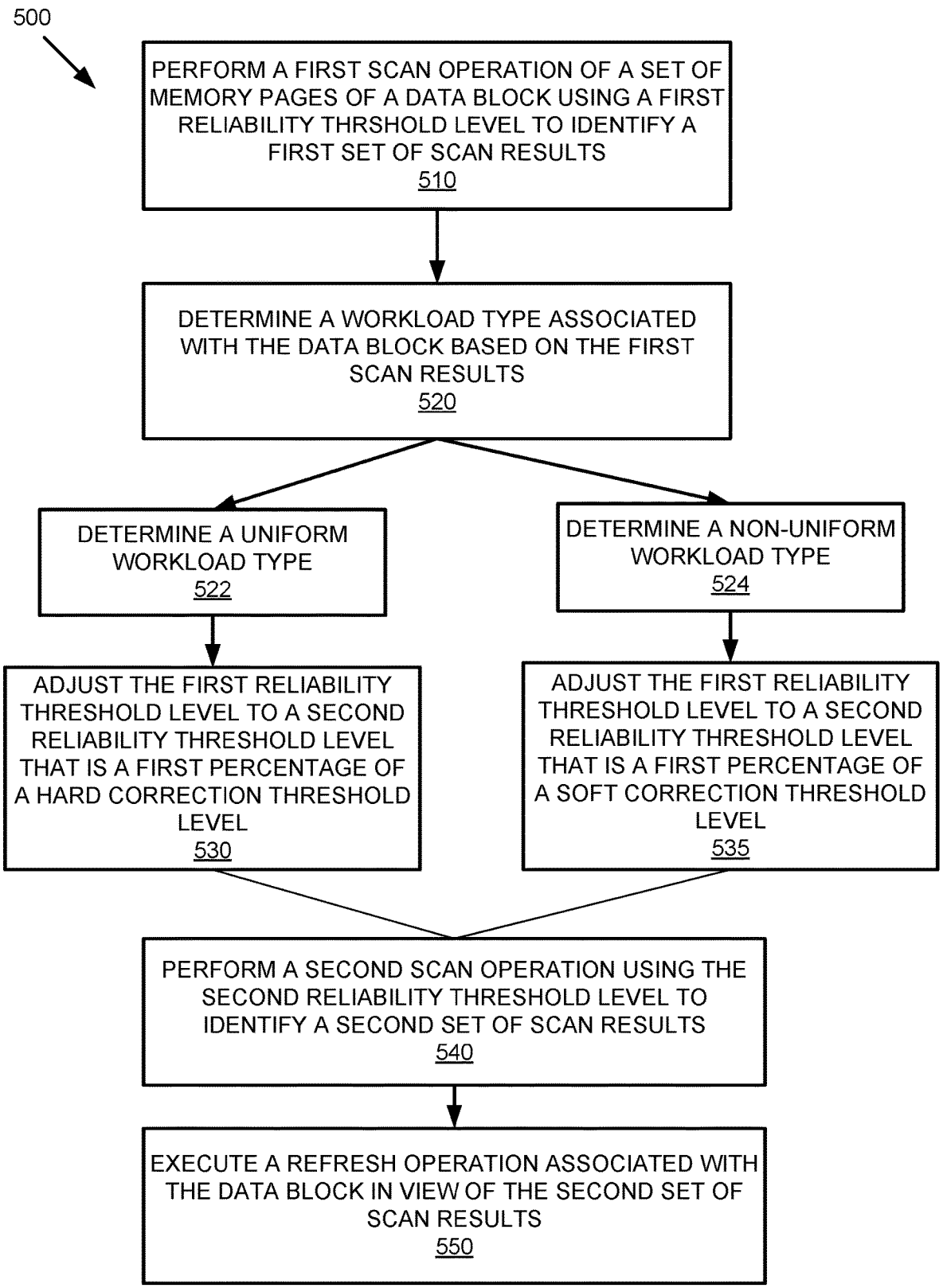
FIG. 5, is a flow diagram of an example method 500 to manage execution of a refresh operation on a data block based on a reliability threshold level that is adjustable based on a workload type associated a set of memory pages of the data block, in accordance with one or more embodiments of the present disclosure

FIG. 5 is a flow diagram of an example method 500 to manage execution of a refresh operation on a data block based on a reliability threshold level that is adjustable based on a workload type associated with a set of memory pages of the data block, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the scan threshold management component 113 of FIG. 1.

At block 510, the processing logic performs a first scan operation of a set of memory pages of a data block using a first reliability threshold level to identify a first set of scan results. In an embodiment, as described above, the scan results include the respective reliability value (e.g., RBER value) for each of the memory pages.

At block 520, the processing logic determines a workload type associated with the data block based on the scan results. In an embodiment, at operation 522, a uniform workload type is determined if the reliability values for each of the set of memory pages are within a certain range of one another. For example, if all of the reliability values are the same or similar (e.g., with the threshold range), the processing logic determines a uniform workload (e.g., sequential read operations) was applied to the data block. Accordingly, the processing logic can determine from the similar reliability values that the memory pages were subject to a uniform read disturb stress level.

In an embodiment, at operation 524, a non-uniform workload type is determined if the reliability values for each of the set of memory pages are not within a certain range of one another. For example, if some of the memory pages have reliability values that are larger than other memory pages (e.g., larger by more than the threshold range value), the processing logic determines a non-uniform workload (e.g., row-hammer read operations) was applied to the data block. Accordingly, the processing logic can determine from the non-uniform reliability values that the memory pages were subject to a non-uniform read disturb stress level.

In operation 530, in response to determining a uniform workload type, the processing logic adjusts the first reliability threshold level to a second reliability threshold level that is a first percentage of a hard correction threshold level. In an embodiment, the hard correction threshold level is a reliability level that is used during the hard correction phase of the error management processing that is performed during a refresh operation. For example, the second reliability threshold level can be set to 15% (or other percentage) of the hard correction threshold level (e.g., 580 bits/16 KB data block).

In operation 535, in response to determining a non-uniform workload type, the processing logic adjusts the first reliability threshold level to a second reliability threshold level that is a first percentage of a soft correction threshold level. In an embodiment, the soft correction threshold level is a reliability level that is used during the soft correction phase of the error management processing that is performed during a refresh operation. For example, the second reliability threshold level can be set to 15% (or other percentage) of the soft correction threshold level (e.g., 1760 bits/16 KB data block).

In operation 540, the processing logic performs a second scan operation using the second reliability threshold level to identify a second set of scan results. As described above, the second reliability threshold level is an adjusted level that is established based on the workload type. In an embodiment, the second set of scan results includes the reliability values of the memory pages of the data block resulting from the second scan operation. In an embodiment, the second scan operation is performed in response to a read count of the data block reaching or exceeding a read count threshold level.

In operation 550, the processing logic executes a refresh operation associated with the data block in view of the second set of scan results. In an embodiment, the refresh operation is executed in response to determining that the reliability values of the second scan results satisfy a condition. In an embodiment, the condition is satisfied if a reliability value of the data block exceeds the second reliability threshold level. For example, as shown in FIG. 3, the refresh operation 330 is executed in response to determining that the reliability value determined during the second scan operation 320 exceeds the adjusted reliability threshold value.

In an embodiment, the refresh operation includes the reading of the data of the data block and the performing of error management processing to generate corrected data to be programmed to a new data block. In some implementations, the error management processing includes a first error correction operation or phase (e.g., hard correction processing) including an error-correcting code (ECC) operation or another type of error detection and correction operation to detect and correct an error. In an embodiment, the error management processing includes a second error correction operation or phase (e.g., soft correction processing) to address one or more bit errors that are not corrected during the hard correction processing. In an example, the soft correction processing can include the execution of soft read operations (e.g., executing of multiple read operations at different read level offset values to identify one or more low confidence bits and high confidence bits and estimate corrected data based on the identified bits,), a parity checking process, or a combination thereof.

Figure 6:
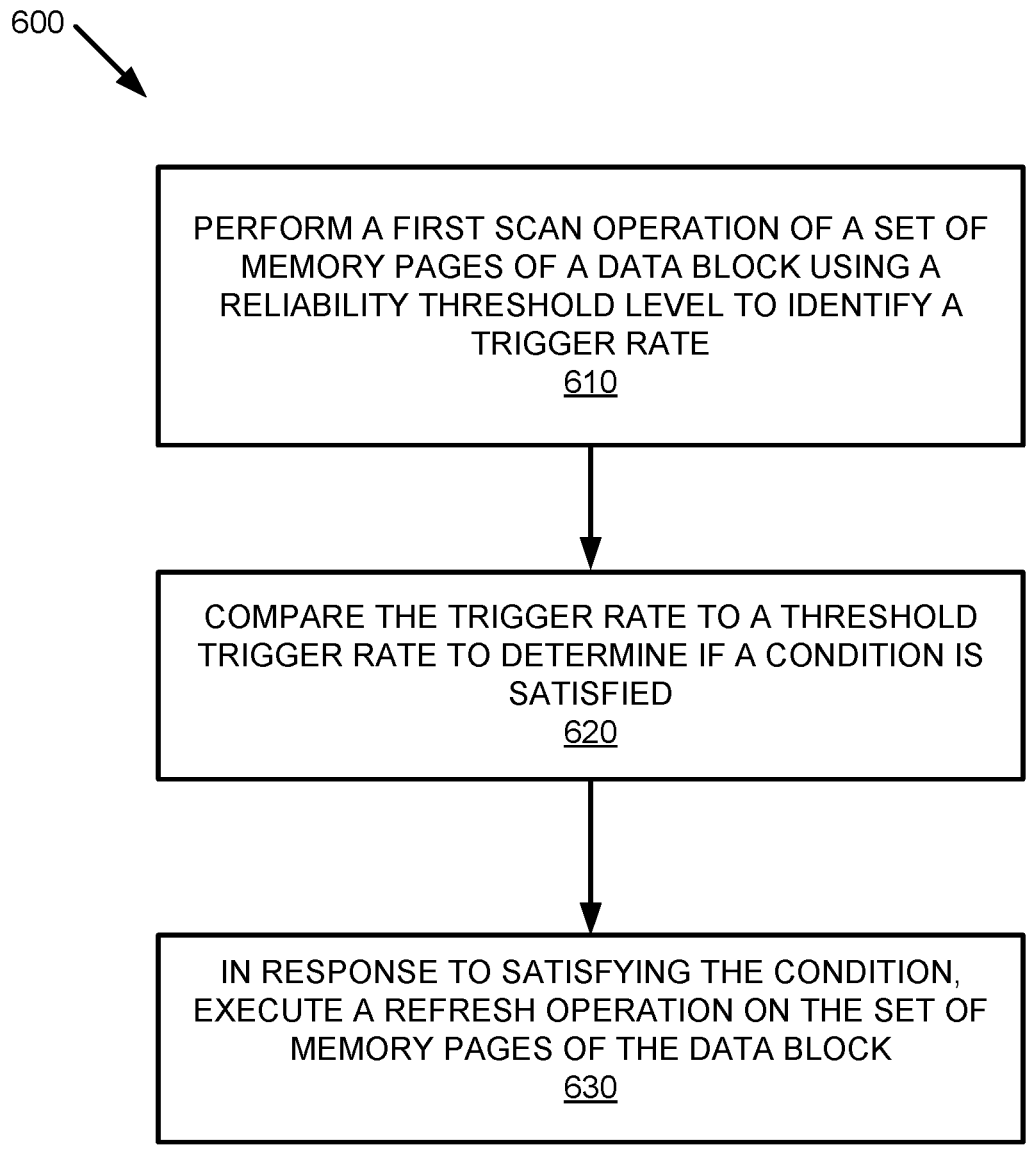
FIG. 6 is a flow diagram of an example method 600 to manage execution of a refresh operation on a data block based on a trigger rate associated a set of memory pages of the data block, in accordance with one or more embodiments of the present disclosure.

FIG. 6 is a flow diagram of an example method 600 to manage execution of a refresh operation on a data block based on a trigger rate associated a set of memory pages of the data block, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the scan threshold management component 113 of FIG. 1.

In operation 610, the processing logic performs a first scan operation of a set of memory pages of a data block using a reliability threshold level to identify a trigger rate. In an embodiment, the reliability threshold level is a reliability level used in a hard correction phase of an error management process. In an embodiment, the data of the set of memory pages is read and hard correction processing is executed. In an embodiment, a number of memory pages that fail the hard correction processing is identified. In an embodiment, the trigger rate is a rate or ratio of a number of memory pages that fail hard correction processing in view of the total number of the set of memory pages that are read.

In operation 620, the processing logic compares the trigger rate to a threshold trigger rate to determine if a condition is satisfied. In an embodiment, the condition is satisfied if the trigger rate is greater than the threshold trigger rate.

In operation 630, in response to satisfying the condition, the processing logic executes a refresh operation on the set of memory pages of the data block. In an embodiment, execution of the refresh operation includes executing error management processing on the data stored in the memory pages and programming the corrected data to a new data block.

Figure 7:
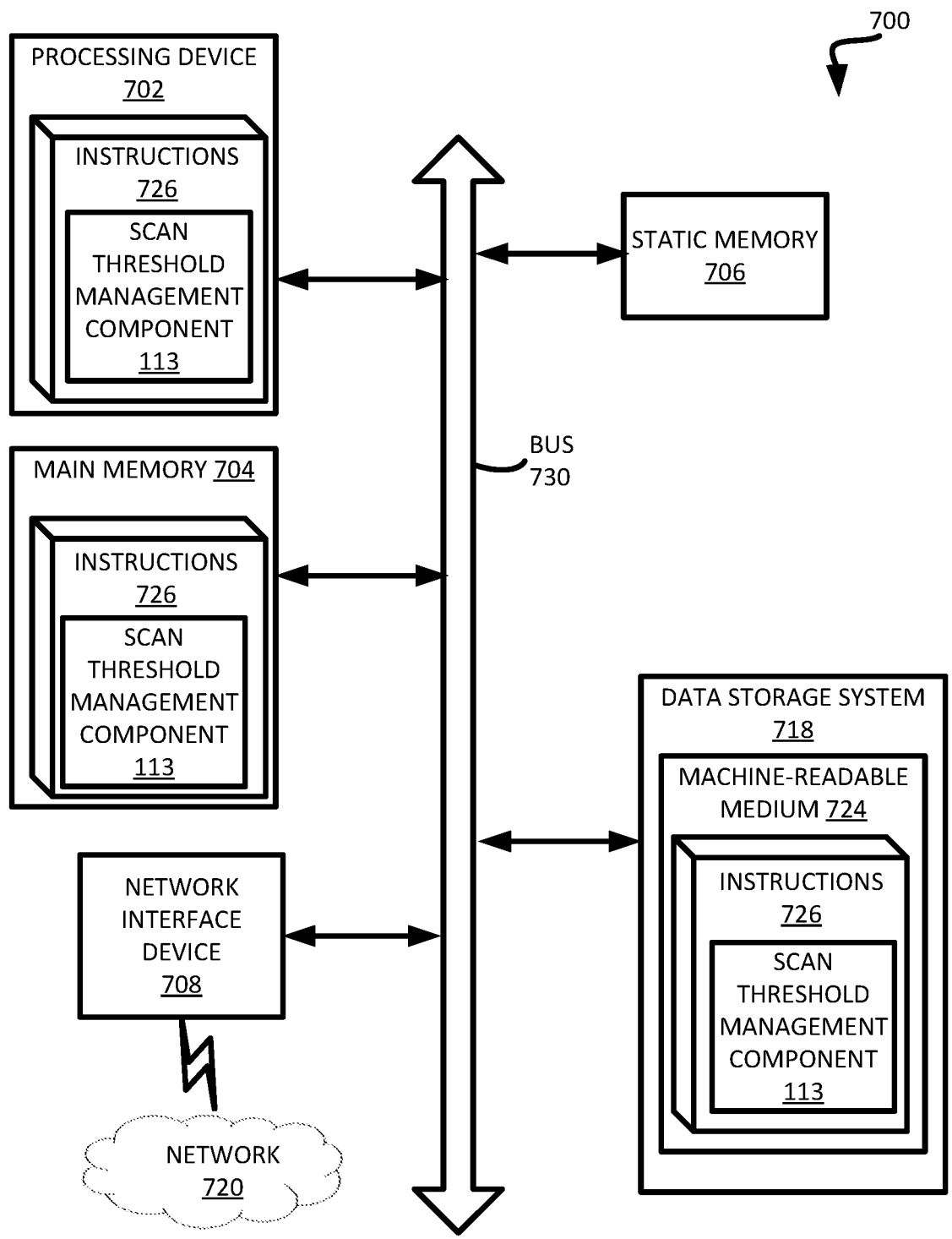
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the scan threshold management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a selective relocation component (e.g., the scan threshold management component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
executing a scan operation to identify a trigger rate associated with a set of memory pages of a data block of a memory device, wherein the trigger rate represents a number of the set of memory pages that fail an error management operation;
comparing the trigger rate to a threshold trigger rate to determine that a condition is satisfied; and
in response to satisfying the condition, executing, by a processing device, a refresh operation on the set of memory pages of the data block.

2. The method of claim 1, wherein the condition is satisfied when the trigger rate exceeds the threshold trigger rate.

3. The method of claim 1, wherein the trigger rate represents a ratio of the number of the set of memory pages that fail the error management operation in view of a total number of the set of memory pages.

4. The method of claim 1, wherein executing the refresh operation further comprises reading data of the set of memory pages of the data block.

5. The method of claim 4, wherein executing the refresh operation further comprises executing a further error management operation on the data to generate corrected data.

6. The method of claim 5, wherein executing the refresh operation comprises programming the corrected data to another data block.

7. The method of claim 1, wherein the threshold trigger rate comprises an adjustable threshold trigger rate.

8. The method of claim 7, wherein the adjustable threshold trigger rate is adjusted in view of a workload type associated with the data block.

9. The method of claim 8, wherein the workload type comprises one of a uniform workload type or a non-uniform workload type.

10. The method of claim 7, wherein the adjustable threshold trigger rate is adjusted in view of a soft correction process.

11. A system comprising:
a memory device; and
a processing device, operatively coupled with the memory device, to perform operations comprising:
executing a scan operation to identify a trigger rate associated with a set of memory pages of a data block of the memory device, wherein the trigger rate represents a number of the set of memory pages that fail an error management operation;
comparing the trigger rate to a threshold trigger rate to determine that a condition is satisfied; and
in response to satisfying the condition, executing a refresh operation on the set of memory pages of the data block.

12. The system of claim 11, wherein the condition is satisfied when the trigger rate exceeds the threshold trigger rate.

13. The system of claim 11, wherein the trigger rate represents a ratio of the number of the set of memory pages that fail the error management operation in view of a total number of the set of memory pages.

14. The system of claim 11, wherein executing the refresh operation further comprises reading data of the set of memory pages of the data block.

15. The system of claim 14, wherein executing the refresh operation further comprises executing a further error management operation on the data to generate corrected data.

16. The system of claim 15, wherein executing the refresh operation comprises programming the corrected data to another data block.

17. The system of claim 11, wherein the threshold trigger rate comprises an adjustable threshold trigger rate.

18. The system of claim 17, wherein the adjustable threshold trigger rate is adjusted in view of a workload type associated with the data block.

19. The system of claim 18, wherein the workload type comprises one of a uniform workload type or a non-uniform workload type.

20. The system of claim 17, wherein the adjustable threshold trigger rate is adjusted in view of a soft correction process.

* * * * *